(12) United States Patent
Yahagi et al.

(10) Patent No.: US 9,013,792 B2
(45) Date of Patent: Apr. 21, 2015

(54) OPTICAL MODULE

(75) Inventors: Akira Yahagi, Annaka (JP); Toshiaki Watanabe, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 313 days.

(21) Appl. No.: 13/421,021

(22) Filed: Mar. 15, 2012

(65) Prior Publication Data

US 2012/0236409 A1   Sep. 20, 2012

(30) Foreign Application Priority Data

Mar. 16, 2011   (JP) .................................. 2011-057540

(51) Int. Cl.
| | | |
|---|---|---|
| *G02F 1/09* | (2006.01) | |
| *C30B 11/00* | (2006.01) | |
| *C30B 13/00* | (2006.01) | |
| *C30B 15/08* | (2006.01) | |
| *C30B 29/24* | (2006.01) | |

(52) U.S. Cl.
CPC ................ *G02F 1/093* (2013.01); *C30B 11/00* (2013.01); *C30B 13/00* (2013.01); *C30B 15/08* (2013.01); *C30B 29/24* (2013.01)

(58) Field of Classification Search
CPC ...... G02F 1/093; G02F 1/0128; G02B 27/286
USPC ....................................... 359/484.02, 484.03
See application file for complete search history.

(56) References Cited

U.S. PATENT DOCUMENTS

| | | | | |
|---|---|---|---|---|
| 7,161,452 | B1* | 1/2007 | Leupold .................... | 335/306 |
| 7,898,720 | B2* | 3/2011 | Nakamura et al. ........... | 359/280 |
| 7,961,391 | B2* | 6/2011 | Hua ........................ | 359/484.03 |
| 8,625,197 | B2* | 1/2014 | Makikawa et al. ...... | 359/484.02 |
| 2005/0225831 | A1 | 10/2005 | Fehn et al. | |
| 2009/0237771 | A1 | 9/2009 | Nakamura et al. | |
| 2011/0133111 | A1 | 6/2011 | Makikawa et al. | |
| 2012/0194906 | A1* | 8/2012 | Nicklaus et al. ......... | 359/484.03 |

FOREIGN PATENT DOCUMENTS

| | | |
|---|---|---|
| JP | 61-114420 U | 7/1986 |
| JP | 8-304737 A | 11/1996 |

(Continued)

OTHER PUBLICATIONS

European Search report for corresponding European Patent Application No. 12159524.3, dated Jul. 4, 2012.

(Continued)

*Primary Examiner* — Frank Font
(74) *Attorney, Agent, or Firm* — Birch, Stewart, Kolasch & Birch, LLP

(57) ABSTRACT

An optical module is provided that includes a Faraday rotator having a Verdet constant at a wavelength of 1.06 μm of at least 0.27 min/(Oe·cm), a first hollow magnet disposed on the outer periphery of the Faraday rotator, and second and third hollow magnet units disposed so as to sandwich the first hollow magnet on the optical axis. The second and third hollow magnet units include 2 or more magnets equally divided in a direction of 90 degrees relative to the optical axis. A magnetic flux density B (Oe) applied to the Faraday rotator is in the range of $0.5 \times 10^4 \leq B \leq 1.5 \times 10^4$. The Faraday rotator is disposed on a sample length L (cm) in the range of $0.70 \leq L \leq 1.10$, and has an external diameter D (cm) in the range of $0.20 \leq D \leq 0.60$.

8 Claims, 3 Drawing Sheets

(56) References Cited

FOREIGN PATENT DOCUMENTS

| | | |
|---|---|---|
| JP | 9-179069 A | 7/1997 |
| JP | 2009-229802 A | 10/2009 |
| JP | 2010-285299 A | 12/2010 |
| WO | WO 2010/143593 A1 | 12/2010 |

OTHER PUBLICATIONS

The Office Action, dated Jan. 6, 2015, issued in the corresponding Japanese Patent Application No. 2012-056961.

* cited by examiner

OPTICAL MODULE

BACKGROUND OF THE INVENTION

1. Technical Field

The present invention relates to an optical module comprising a Faraday rotator, which is an essential component of an optical isolator that is used in a wavelength region of about 1 μm.

2. Background Art

Conventionally, industrial laser machines that are used in applications such as cutting, welding, or marking employ a $CO_2$ laser (wavelength 10.6 μm) or a lamp pumped YAG laser (wavelength 1 μm).

In recent years, the requirements for machining performance have become more strict, and there has been a desire for a laser machine having higher precision, higher output, and longer life. Among such market requirements, attention is being focused on fiber lasers. A fiber laser is characterized by all optical paths being formed from optical fiber and by being capable of fiber-outputting laser light having high precision and high output by amplifying 1-μm-band light emitted from a laser diode (LD) light source using fiber doped with a rare-earth element such as ytterbium (Yb). Compared with a lamp pumped YAG laser with the same wavelength band, a fiber laser has high conversion efficiency for excitation light, excellent heat dissipation so that it can be air-cooled, and does not require pumping by a lamp, and it is therefore attracting attention because of merits such as low power consumption, higher output, and longer life.

However, although a fiber laser is characterized by a narrow light emission spectrum and excellent conversion efficiency, it is very sensitive to returning light due to reflected light, its properties become unstable if reflected light returns from an end face bonded to the optical fiber or from a metal surface having high reflectance and, consequently, this causes the possibility that the LD light source unit might be damaged due to high output light emission. Therefore, in order to guarantee stable operation of a fiber laser, it is essential to block light that has been reflected and is returning to the light emitting source from the optical fiber by disposing an optical isolator that has the function of transmitting light in the forward direction and blocking light in the reverse direction between the light emitting source and a workpiece for the purpose of preventing reflected light from returning to a light-emitting device, which is the light emitting source.

Here, the optical module is formed from two essential components, that is, a Faraday rotator and a magnet that applies a magnetic field in the direction of light transmission of the Faraday rotator (optical axis direction). When light is incident on the Faraday rotator in this configuration, a phenomenon occurs in which the plane of polarization rotates in the Faraday rotator. This is a phenomenon called the Faraday effect; the angle through which the plane of polarization rotates is called the Faraday rotation angle, and its magnitude $\theta$ is represented by the equation below.

$$\theta = V \times H \times L$$

wherein V is the Verdet constant, which is a constant determined by the material of the Faraday rotator and measurement wavelength, H is the magnetic flux density, and L is the length of the Faraday rotator.

As can be understood from this equation, in order to obtain a desired Faraday rotation angle in a rotor having a certain fixed magnitude for the Verdet constant, the larger the magnetic field applied to the Faraday rotator the shorter the length of the rotator can be, and the longer the length of the rotator the smaller the magnetic flux density can be.

As a material for the Faraday rotator, an oxide having a specific composition has been disclosed in JP-A-2010-285299 (JP-A denotes a Japanese unexamined patent application publication).

An optical isolator is constituted by disposing a pair of polarizers on the side on which light is incident and the side on which light emerges from the above-mentioned optical module, and in order to have a function as an optical isolator, in general a Faraday rotation angle of on the order of 45° is necessary. Specifically, the plane of polarization of light that enters the optical isolator is rotated through 45° by the Faraday rotator, and the light is transmitted through the incident/emergent polarizers whose angles have been adjusted individually. On the other hand, the plane of polarization of returning light is rotated through 45° in the opposite direction by utilizing the nonreciprocity of the Faraday rotator to thus give an orthogonal plane of polarization that is at 90° to the incident polarizer, and the light cannot be transmitted. The optical isolator utilizes this phenomenon, allows light to be transmitted only in a single direction, and blocks light that has returned after being reflected.

SUMMARY OF THE INVENTION

Problems to be Solved by the Invention

A conventionally used optical isolator uses a Faraday rotator such as for example a terbium gallium garnet (TGG) crystal. Since the Verdet constant of TGG is on the order of 0.135 min/(Oe·cm) at a wavelength of 1.06 μm, in order to satisfy a Faraday rotation angle of 45°, it is necessary for its length to be at least on the order of 2.0 cm. Because of this, in order to increase the magnetic flux density applied to the Faraday rotator, it is necessary to make the magnet shape around it larger, and the overall size of the optical isolator inevitably increases. As a result, there is a limit in terms of design within an optical device, magnetic field leakage to the outside of the optical isolator increases, and handling is difficult. 1 min means 1/60 of a degree.

Furthermore, since the extinction ratio of TGG is on the order of 30 dB at a wavelength of 1.06 μm, the isolation value of an assembled optical isolator is on the order of 30 dB. As a result, when the level of return light to the laser is high, as a countermeasure therefor multiple optical isolator stages are used, etc., thus causing restrictions in cost and the degree of spatial freedom of the overall device.

It is an object of the present invention to provide a small-size and high extinction ratio optical device. In particular, it is to provide a small-size Faraday optical device having a high extinction ratio that is suitable as an optical isolator having high isolation properties used in a high output laser used for laser machining, optical measurement, optical communication, etc., for example a fiber laser.

It is another object of the present invention to provide an optical module that combines the use of a Faraday rotator having a high Faraday effect and a high extinction ratio with a magnet having a small external form. Other objects of the present invention will become apparent from the explanation below.

Means for Solving the Problems

The above-mentioned various objects have been accomplished by means <1> and <9> below. They are listed together with preferred embodiments <2> to <8> and <10>.

<1> An optical module comprising a Faraday rotator having a Verdet constant at a wavelength of 1.06 μm of at least 0.27 min/(Oe·cm), and a first hollow magnet disposed on the outer periphery of the Faraday rotator and second and third hollow magnet units disposed so as to sandwich the first hollow magnet on the optical axis, the second and third hollow magnet units comprising 2 or more magnets equally divided in a direction of 90 degrees relative to the optical axis, the Faraday rotator having applied thereto a magnetic flux density B (Oe) in the range of Formula (1) below, the Faraday rotator being disposed on a sample length L (cm) in the range of Formula (2) below, and the Faraday rotator having an external diameter D (cm) in the range of Formula (3) below, $$0.5 \times 10^4 \leq B \leq 1.5 \times 10^4 \quad (1)$$

$$0.70 \leq L \leq 1.10 \quad (2)$$

$$0.20 \leq D \leq 0.60 \quad (3)$$

<2> the optical module according to <1>, wherein the Faraday rotator comprises an oxide represented by Formula (I) below in at least 99 wt %

$$(Tb_xR_{1-x})_2O_3 \quad (I)$$

wherein x is $0.5 \leq x \leq 1.0$, and R comprises at least one element selected from the group consisting of scandium, yttrium, and lanthanoid elements other than Tb),
<3> the optical module according to <2>, wherein the oxide is a single crystal,
<4> the optical module according to <2>, wherein the oxide is a ceramic,
<5> the optical module according to any one of <1> to <4>, wherein the Faraday rotator has a cylindrical shape and has an insertion loss of no greater than 1 dB and an extinction ratio of at least 25 dB,
<6> the optical module according to any one of <1> to <5>, wherein the first hollow magnet and the second and third hollow magnet units comprise a neodymium-iron-boron (NdFeB) system magnet,
<7> the optical module according to any one of <1> to <6>, wherein the first hollow magnet has a magnetic field polarity in the direction of the optical axis and the second and third hollow magnet units have a magnetic field polarity in a direction normal to the optical axis,
<8> the optical module according to any one of <1> to <7>, wherein the first hollow magnet, the second hollow magnet unit, and the third hollow magnet unit are mounted in the interior of a carbon steel housing,
<9> a process for producing the optical module according to any one of <1> to <8>, the process comprising a step of subjecting an outer peripheral face of a roughly machined Faraday rotator to 1.0 mm or greater of peripheral grinding, and
<10> the process for producing an optical module according to <9>, wherein it comprises a step of subjecting opposite end faces of a roughly machined Faraday rotator to 0.5 mm or greater of end face polishing for one face.

MODE FOR CARRYING OUT THE INVENTION

Figure 1:
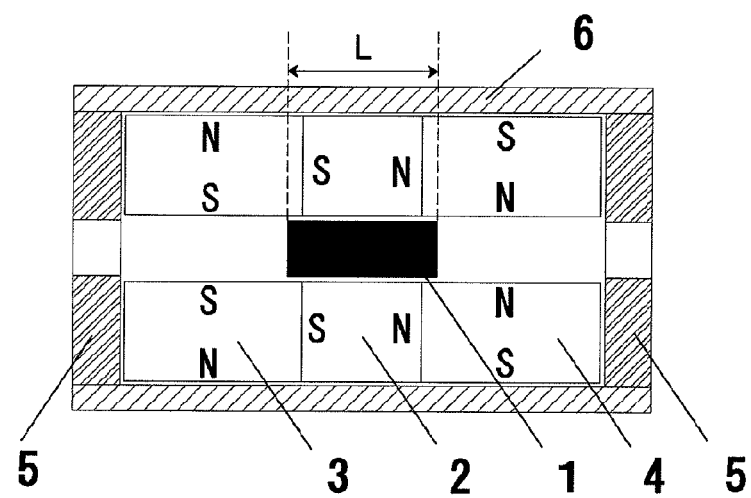
FIG. 1 is a cross-sectional schematic drawing showing an example of the constitution of the optical module of the present invention.

The optical module of the present invention comprises a Faraday rotator having a Verdet constant at a wavelength of 1.06 μm of at least 0.27 min/(Oe·cm), and a first hollow magnet disposed on the outer periphery of the Faraday rotator and second and third hollow magnet units disposed so as to sandwich the first hollow magnet on the optical axis, the second and third hollow magnet units comprising 2 or more magnets equally divided in a direction of 90 degrees relative to the optical axis, the Faraday rotator having applied thereto a magnetic flux density B (Oe) in the range of Formula (1) below, an external diameter D (cm) and a sample length L (cm) on which the Faraday rotator is disposed being within the ranges of Formulas (2) and (3) below $$0.5 \times 10^4 \leq B \leq 1.5 \times 10^4 \quad (1)$$

$$0.70 \leq L \leq 1.10 \quad (2)$$

$$0.20 \leq D \leq 0.60 \quad (3).$$

The present invention is explained in detail below.
The optical module of the present invention is preferably used for laser light having a wavelength region of 0.90 to 1.10 μm. Such a laser includes a lamp pumped YAG laser.
In addition, a person skilled in the art can modify the optical module of the present invention so that it can be used for laser light having a wavelength region other than the above-mentioned region.
An example of the basic constitution of the optical module of the present invention is explained below by reference to the drawings.
FIG. 1 is a cross-sectional schematic drawing showing an example of the constitution of the optical module of the present invention.
In FIG. 1, the shape of a Faraday rotator 1 is preferably cylindrical since it is easy to carry out peripheral grinding. The explanation below is given with a cylindrical Faraday rotator as an example.
Disposed on the outer periphery of the Faraday rotator 1 are a first hollow magnet 2, and a second hollow magnet unit 3 and a third hollow magnet unit 4 sandwiching the first hollow magnet on the optical axis. When the Faraday rotator 1 is cylindrical, it is preferable for all of the first hollow magnet 2, the second hollow magnet unit 3, and the third hollow magnet unit 4 to be hollow cylinders, and it is preferable for the central axis of the Faraday rotator 1 and the central axis of the hollow portion of the first hollow magnet 2 and the hollow portions of the two hollow magnet units 3 and 4 to be coaxial. Furthermore, the outer diameter of the Faraday rotator 1 is substantially the same as the inner diameter of the hollow portion of the first hollow magnet 2 and the inner diameter of the hollow portions of the two hollow magnet units 3 and 4, and after the optical module is assembled, the Faraday rotator 1 is disposed in the center of the first hollow magnet 2.

The first hollow magnet 2, the second hollow magnet unit 3, and the third hollow magnet unit 4 are disposed so that their hollow portions are coaxial with the optical axis. Both of these two hollow magnet units 3 and 4 are a collection of a plurality of magnets equally divided into two or more in a direction at 90 degrees to the optical axis.

Figure 2:
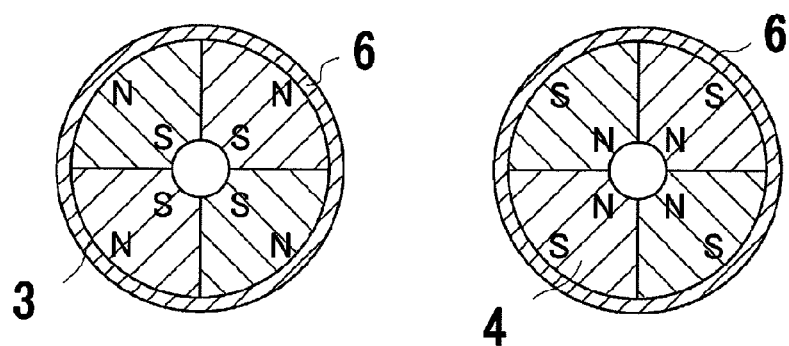
FIG. 2 is a cross-sectional schematic drawing of a second hollow magnet unit 3 and a third hollow magnet unit 4.
Figure 3:
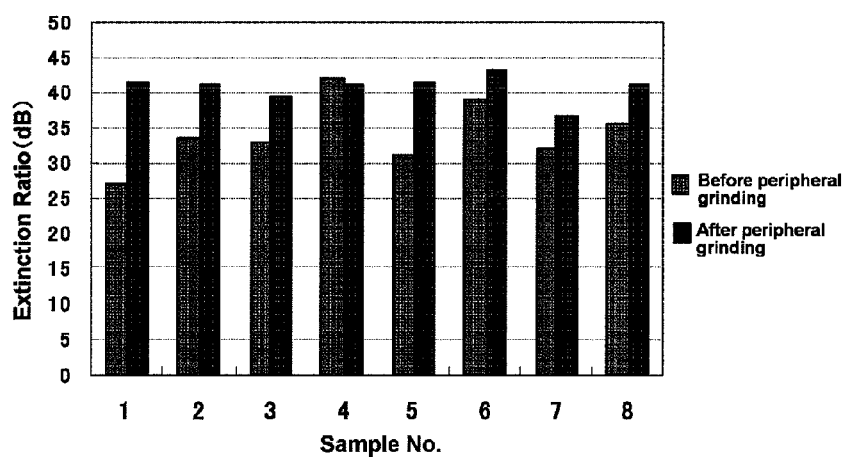
FIG. 3 is a diagram showing extinction ratio before and after the outer diameter D (0.2 to 0.6 cm) of a Faraday rotator used in Examples 1 to 3 is peripherally ground to 0.35 cm.

FIG. 2 is a cross-sectional schematic drawing showing one embodiment of the two hollow magnet units 3 and 4. Both of the two hollow magnet units are a collection of 4 magnets formed by dividing a cylindrical magnet into four 90 degree portions. A magnet unit (collection) divided into 4 portions is preferable since its machining suitability is excellent. Other than this configuration of the magnet unit divided into four, a collection of two magnets divided into two 180 degree portions or a collection of three magnets divided into three 120 degree portions may also be used.

As shown in FIG. 2, the second hollow magnet unit 3 and the third hollow magnet unit 4 are each housed in the interior of a housing 6.

In the embodiment shown in FIG. 2, the magnets formed by dividing a cylindrical magnet into four have the magnetic field polarity thereof in the circumferential direction. In this case, since the magnets have mutually opposite magnetic forces, by making the outer diameter of the outer periphery of the combined magnet unit and the inner diameter of the housing 6 substantially equal to each other so that the magnet unit can be inserted, they can be fixed in the interior of the housing 6 simply by virtue of the magnetic forces thereof. Since, by the use of this fixing method, the first hollow magnet 2 can be fixed without any gap while having opposite sides thereof retained by means of the second hollow magnet unit 3 and the third hollow magnet unit 4, fixation of all of the constituent magnets does not require any adhesive, etc., thus enabling mounting to be achieved with high reliability.

The optical module of the present invention comprises a Faraday rotator having a Verdet constant of at least 0.27 min/(Oe·cm) at a wavelength of 1.06 μm. This Faraday rotator is now explained.

The Faraday rotator that can be used in the present invention has a Verdet constant of at least 0.27 min/(Oe·cm) at a wavelength of 1.06 μm. The Verdet constant is not particularly limited as long as it is at least 0.27 min/(Oe·cm), but it is preferable for it to have a large Verdet constant. When the Verdet constant is less than 0.27 min/(Oe·cm), the length of the Faraday rotator required to give a Faraday rotation angle of 45 degrees becomes large, and it becomes difficult to reduce the size of the optical module.

Furthermore, it is preferable for the Verdet constant of the Faraday rotator at a wavelength of 1.06 μm to be no greater than 0.36 min/(Oe·cm) from the viewpoint of ease of production.

In the present invention, the Verdet constant may be measured in accordance with a standard method, which is not particularly limited.

Specifically, a predetermined thickness of an oxide is cut out, subjected to mirror polishing, the Faraday rotator is set in a permanent magnet having a known magnetic flux density, and the Verdet at a wavelength of 1.06 μm is measured. The measurement conditions are 25° C.±10° C., and measurement is carried out in air.

An external diameter D (cm) and a sample length L (cm) on which the Faraday rotator is disposed in the optical module of the present invention are within the ranges of Formulae (2) and (3) below.

$$0.70 \leq L \leq 1.10 \tag{2}$$

$$0.20 \leq D \leq 0.60 \tag{3}$$

When the sample length L exceeds 1.10 cm, it becomes difficult to reduce the size of the optical module, and when it is less than 0.70 cm the magnitude of the magnetic flux density in order to obtain a required Faraday rotation angle increases, thus making it difficult to reduce the size of the optical rotator. When the outer diameter D exceeds 0.60 cm, it becomes necessary to make the outer shape of the magnet larger and it also becomes difficult to reduce the size of the optical module, and when it is less than 0.20 cm, there is difficulty in machining such as grinding of the outer periphery and it is not suitable in practice.

The sample length referred to here means the length on the optical axis length of the Faraday rotator, and is denoted by reference symbol L in FIG. 1.

The Faraday rotator used in the optical module of the present invention is preferably produced by a production process comprising a step of subjecting opposite end faces of a roughly machined Faraday rotator to 0.5 mm or greater of end face polishing for one face and a step of subjecting the outer peripheral face to 1.0 mm or greater of peripheral grinding.

Here, the polishing of opposite end faces is preferably within a range of at least 0.5 mm but no greater than 0.8 mm for one face. A method for polishing may employ a method know to a person skilled in the art, and examples thereof include rough polishing by means of a surface grinding machine followed by one face polishing by means of a polishing agent such as colloidal silica.

Furthermore, peripheral grinding of the outer peripheral face is preferably carried out so that it is at least 1.0 mm but no greater than 1.6 mm with respect to the radius of the outer peripheral face. A method for carrying out peripheral grinding may also employ a method known to a person skilled in the art, and examples thereof include grindstone grinding by means of a centerless machine.

The Faraday rotator used in the present invention preferably comprises an oxide represented by Formula (I) below in at least 99 wt %.

$$(Tb_xR_{1-x})_2O_3 \tag{I}$$

wherein x is $0.5 \leq x \leq 1.0$, and R comprises at least one element selected from the group consisting of scandium, yttrium, and lanthanoid elements other than Tb, and is preferably formed from an element selected from the group consisting of scandium, yttrium, and lanthanoid elements other than Tb.

The content of the above-mentioned oxide is preferably at least 99.9 wt %, and more preferably at least 99.99 wt %.

In Formula (I), R preferably comprises at least one element selected from the group consisting of scandium, yttrium, lanthanum, europium, gadolinium, and lutetium.

Here, R may be one type on its own, or a plurality of Rs may be contained at any ratio, and it is not particularly limited.

Among them, from the viewpoint of starting material availability, R is preferably yttrium, gadolinium, or lutetium, and more preferably yttrium.

In Formula (I), x is at least 0.5 but no greater than 1.0. That is, the oxide represented by Formula (I) comprises $Tb_2O_3$ in at least 50 mole % on a molar ratio basis.

X is preferably at least 0.5 and less than 1.0, more preferably at least 0.5 but no greater than 0.8, and yet more preferably at least 0.5 but no greater than 0.75. It is preferable for x to be in the above-mentioned range since a high Verdet constant is obtained and the transparency is excellent. It is particularly preferable for x to be no greater than 0.8 since the occurrence of cracks during cooling after crystal growth is suppressed and the crystal is prevented from becoming cloudy.

Furthermore, the oxide represented by Formula (I) is preferably a solid solution.

The 'solid solution' referred to in the present embodiment means a state in which terbium at lattice points of a crystal layer of terbium oxide, which is a starting material powder, is replaced completely irregularly by another type of element (e.g. yttrium, etc.). Therefore, it includes a single crystal, a polycrystal, a polycrystalline ceramic produced by sintering, etc.

Among them, the oxide represented by Formula (I) above is preferably a single crystal or a ceramic, and more preferably a single crystal.

Another component that the Faraday rotator that can be used in the optical module of the present invention can comprise is preferably a metal oxide selected from the group consisting of alkaline earth metal oxides, oxides of Group 13 elements, oxides of Group 14 elements, and oxides of Group 4 elements, Group 5 elements (V, Nb, Ta, etc.), Group 6 elements (Mo, W, etc.), and Group 17 elements (F, Cl, Br, etc.).

The Faraday rotator that can be used in the optical module of the present invention preferably comprises an oxide of one or more elements of alkaline earth metals, Group 13 elements, Group 14 elements, Group 4 elements, Group 5 elements (V, Nb, Ta, etc.), Group 6 elements (Mo, W, etc.), and Group 17 elements (F, Cl, Br, etc) in at least 0.0001 wt % but less than 1.0 wt %.

The content of these oxides is preferably at least 0.000001 wt % but less than 1.0 wt % of the oxide of the present invention, more preferably 0.00001 to 0.1 wt %, and yet more preferably 0.0001 to 0.01 wt %.

Specifically, examples of the oxide of an alkaline earth metal include magnesium oxide, strontium oxide, barium oxide, examples of the oxide of a Group 13 element include aluminum oxide (alumina) and gallium oxide, examples of the oxide of a Group 14 element include silicon oxide, germanium oxide, and tin oxide, and examples of the oxide of a Group 4 element include titanium oxide, zirconium oxide, and hafnium oxide.

The above-mentioned metal oxide is contained as a residue of a dopant that is added when preparing a single crystal or a sintering adjuvant that is added when preparing a ceramic.

As the dopant that is added when preparing a single crystal, an oxide of an alkaline earth metal is suitable, and magnesium oxide, strontium oxide, barium oxide, etc. are preferable. These oxides are preferably contained in at least 0.000001 wt % but less than 1.0 wt % relative to the entire Faraday rotator, more preferably 0.00001 to 0.1 wt %, and yet more preferably 0.0001 to 0.01 wt %.

Examples of the sintering adjuvant include an alkaline earth metal carbonate such as magnesium carbonate, alumina, gallium oxide, titanium oxide, silicon oxide, germanium oxide, zirconium oxide, and hafnium oxide. In addition, when for example an alkaline earth metal carbonate is used as a sintering adjuvant, it is oxidized by sintering and contained in the oxide obtained as an oxide of the alkaline earth metal.

The content of the alkaline earth metal oxide is preferably 0.00001 to 1.0 wt % of the entire Faraday rotator, more preferably 0.0001 to 0.1 wt %, and yet more preferably 0.0001 to 0.01 wt %.

There are cases in which there might be contamination with an auxiliary component when producing a Faraday rotator such as a single crystal oxide or a ceramic or materials therefor, and examples of such cases include a case in which there is contamination with a component constituting a crucible. The oxide of the present invention does not exclude such contamination with an unintended auxiliary component, but the amount of the contaminant together with the above-mentioned other component is preferably less than 1 wt % in total, more preferably no greater than 0.1 wt %, and particularly preferably no greater than 0.01 wt %.

—Single Crystal—

The Faraday rotator that can be used in the present invention may employ a single crystal of the oxide represented by Formula (I) above.

A method for preparing an oxide crystal is not particularly limited and examples thereof include a floating zone melting method, a micro-pulling-down method, a pulling up method, a skull melting method, and a Bridgman method. These methods are described in detail in 'Bulk Single Crystals, Latest Techniques and Application Development' (Edited by Tsuguo Fukuda, CMC Publishing Co., Ltd. March, 2006) and 'Crystal Growth Handbook' (Edited by 'Crystal Growth Handbook' Editorial Committee of the Japanese Association for Crystal Growth, Kyoritsu Publishing, September 1995).

In preparation of a single crystal oxide, as described above, it is preferable to carry out doping with an oxide of an alkaline earth metal (e.g. magnesium, calcium, strontium, barium) at 0.001 to 0.01 wt % for the purpose of stable crystallization.

Representative production processes are described in detail below.

<Floating Zone Melting Method>

One embodiment in which a single crystal oxide is prepared by the floating zone melting method is described.

As a process for producing a single crystal by the floating zone melting method, JP-A-62-271385 and JP-A-2010-285299 may for example be referred to.

First, as a starting material, high purity (preferably at least 99.9 wt %) powder starting materials ($Tb_2O_3$, $R_2O_3$, and other components) are prepared and mixed, thus preparing a mixed powder. R is preferably selected from the group consisting of scandium, yttrium, lanthanum, europium, gadolinium, and lutetium.

Preparation of a mixed powder used in the production and its molded product are described later.

<Micro-Pulling-Down Method>

As a method for preparing a single crystal oxide, a case in which a single crystal is prepared by the micro-pulling-down method, which is another method, is explained below. With regard to the micro-pulling-down method, JP-A-2001-226196 and JP-A-2010-285299 may be referred to.

First, starting material powders are weighed so as to give a desired molar ratio. When the above-mentioned powder starting materials are charged into equipment, they may be fully mixed and dried or sintered, and a known method may be used as appropriate. A method for preparing a mixed powder is described later.

—Ceramic (Transparent Ceramic)—

The oxide represented by Formula (I) above may be a polycrystalline ceramic as long as the transparency at a wavelength of 1.06 μm is high and there is no anisotropy such as thermal strain (in the present invention, also called a transparent ceramic). The transparent ceramic referred to in the present invention means a ceramic whose transmittance at a wavelength of 1.06 µm and a sample length of 0.3 cm is at least 70%.

When producing a single crystal, heating to a high temperature so as to give a molten state is necessary. The melting point of terbium oxide is about 2,600° C., and the melting point of yttrium oxide is about 2,300° C.; in the case of a solid solution of these two oxides it is necessary to heat to a temperature midway therebetween, and it is therefore necessary to heat to a very high temperature. Therefore, when preparing a single crystal by melting in a crucible, selection of the crucible is very limited, such that it is rhenium, tungsten, an alloy thereof, etc.

On the other hand, in the case of a transparent ceramic, it is not necessary to heat it up to its melting point, and it is made transparent at a temperature less than the melting point by pressure sintering. It is also possible to make it compact by adding a sintering adjuvant during sintering so as to increase the sintering density.

As a method for preparing a transparent ceramic, a conventionally known production process may be selected as appropriate and used, and it is not particularly limited. Examples of a process for producing a transparent ceramic include a method in which Hot Isostatic Pressing is carried out, a method in which a solid phase method and a press molding method are combined, and a method in which vacuum sintering is carried out using template molding, and they are described in Akio Ikesue 'From Optical Single Crystal To Optical Polycrystal' Japanese Journal of Applied Physics, Vol. 75, No. 5, 579-583 (2006), Takagimi Yanagitani and Hideki Yagi 'Present and Future of Ceramic Laser Materials' Laser Research, Vol. 36, No. 9, 544-548 (2008), etc.

As a method for preparing a transparent ceramic, one example of a case in which a transparent ceramic is prepared using the Hot Isostatic Pressing (HIP) method is explained below.

First, a mixed powder of starting material powders ($Tb_2O_3$, $R_2O_3$, and other components) is prepared. The method for preparing a mixed powder is described later. A solvent, a binder, a plasticizer, a lubricant, etc. are added to the obtained mixed powder and wet-mixed to give a slurry. In this process, it is also preferable to add the above-mentioned sintering adjuvant at a predetermined amount, preferably 0.00001 to 1.0 wt % of the entire starting material, more preferably 0.0001 to 0.1 wt %, and yet more preferably 0.001 to 0.01 wt %. The slurry thus obtained is treated in a spray dryer to thus be dried, and then subjected to molding. Molding may be carried out in one stage or in multiple stages. After molding, it is preferable to subject it to degreasing by heating (preferably 400° C. to 600° C.).

Following this, it is preferable to carry out calcining in a vacuum furnace. The calcining conditions are preferably 1,600° C. to 2,000° C., more preferably 1,700° C. to 1,900° C., and yet more preferably 1,750° C. to 1,850° C. The calcining time is preferably 1 to 50 hours, more preferably 2 to 25 hours, and yet more preferably 5 to 20 hours. In this process, the rate of temperature increase up to about 1,200° C. is preferably 100° C. to 500° C./hr, more preferably 200° C. to 400° C./hr, and yet more preferably 250° C. to 350° C./hr, and the rate of temperature increase thereabove is preferably decreased down to 25° C. to 75° C./hr. The degree of vacuum at the time of calcining is preferably no greater than 1 Pa, and more preferably no greater than $1 \times 10^{-1}$ Pa.

Furthermore, after the above-mentioned calcining, in order to further increase transparency, a treatment by the Hot Isostatic Pressing (HIP) method is carried out. The treatment temperature is preferably higher than the calcining temperature, preferably 1,600° C. to 2,000° C., more preferably 1,700° C. to 1,900° C., and yet more preferably 1,750° C. to 1,850° C. The treatment pressure is preferably 10 to 1,000 MPa, more preferably 20 to 500 MPa, and yet more preferably 40 to 200 MPa. The treatment time is not particularly limited, but is preferably no greater than 50 hours, more preferably no greater than 25 hours, and yet more preferably no greater than 10 hours. It is preferably at least 15 minutes, more preferably at least 30 minutes, and yet more preferably at least 1 hour.

<Preparation of Mixed Powder and Molded Product>

For example, a single crystal or transparent ceramic of an oxide represented by Formula (I) above may be produced by the above-mentioned method, etc. by weighing so as to give a desired molar ratio for the mixed powder and the molded product (including a sintered product) thereof.

As powder materials ($Tb_2O_3$, $R_2O_3$, and other component), high purity materials are preferably used, and the purity is preferably at least 99.9 wt %, more preferably at least 99.99 wt %, and yet more preferably at least 99.999 wt %. In addition, R in $R_2O_3$ has the same meaning as R in Formula (I) and a preferred range is also the same.

In addition, terbium oxide is not limited to $Tb_2O_3$, and $Tb_4O_7$ may also be used, but because of the excellent crystallinity of the oxide obtained it is preferable to use $Tb_2O_3$.

After weighing powder materials at a desired molar ratio, they may be dry-mixed or wet-mixed without any particular limitations. Furthermore, after wet- or dry-mixing, calcining may be carried out, and after calcining, grinding may further be carried out.

Specific examples include a method in which, after they are dry-mixed using a ball mill, etc., a mixed powder is calcined under an inert gas atmosphere. The calcining temperature and calcining time are not particularly limited, but the calcining temperature is preferably 600° C. to 2,000° C., more preferably 800° C. to 1,800° C., and yet more preferably 1,000° C. to 1,800° C. Examples of the inert gas atmosphere include a rare gas atmosphere and a nitrogen gas atmosphere, and it is preferable to carry out calcining under an argon atmosphere. Furthermore, the calcining time is not particularly limited and may be selected as appropriate according to the water content of the mixed powder or the calcining temperature, but is preferably 1 to 100 hours, more preferably 5 to 50 hours, and yet more preferably 10 to 30 hours. Furthermore, when carrying out calcining, it is preferable to carry out mixing by grinding using a ball mill, etc. after calcining.

Moreover, for the purpose of sharpening the average particle size distribution of the mixed powder and increasing the purity, powder materials may be melted, recrystallized, ground, and then used as starting material powders.

Specifically, high purity (e.g. at least 99.9 wt %) starting material powders are prepared and weighed so that $Tb_2O_3$: $R_2O_3$ is a desired molar ratio. There can be cited a method in which these starting material powders are dissolved as a 1 mol/L nitric acid aqueous solution, a 1 mol/L ammonium sulfate aqueous solution is added thereto and mixed, ultrapure water is further added thereto so as to adjust the concentration, and a 0.5 mol/L ammonium bicarbonate aqueous solution is added dropwise to the aqueous solution thus obtained while stirring at a constant dropwise addition rate until the pH becomes 8, the mixture is then allowed to stand at room temperature for a few days while stirring, then filtered and washed with ultrapure water, and dried at 150° C. for a few days. The mixed powder thus obtained is precalcined in an alumina crucible under an inert atmosphere such as a nitrogen atmosphere or an argon atmosphere preferably at 800° C. to 1,500° C., more preferably 1,000° C. to 1,400° C., and yet more preferably 1,100° C. to 1,200° C., preferably for 0.5 to 10 hours, more preferably 1 to 7 hours, and yet more preferably 2 to 4 hours. The reason for use of the inert atmosphere here is to keep the valence of the terbium oxide unchanged.

After the powder materials are mixed well, the mixture may be molded into a desired shape and size using a molding machine. The molded shape is not particularly limited; it may be selected as appropriate according to a device in which it is used, etc., and may be molded into for example a columnar shape.

Examples of a method for molding the powder material include a method in which powder starting materials that have been dry-mixed well are molded under pressure using a mold.

It is also possible to add an organic binder to the powder materials to give a slurry; this is molded and then calcined to give a sintered product, and this may be used as a molded product of the starting materials. The sintering temperature is preferably 600° C. to 2,000° C., more preferably 800° C. to 1,800° C., and yet more preferably 1,000° C. to 1,800° C. The sintering atmosphere is preferably a rare gas or an inert gas atmosphere, and yet more preferably an argon atmosphere. The sintering time is not particularly limited, but is preferably 1 to 100 hours, more preferably 5 to 50 hours, and yet more preferably 10 to 30 hours.

When a transparent ceramic is produced by the HIP method, after a molded product is produced, this is treated by the HIP method.

Specific examples of the process for producing a molded product include a method in which a solvent, a binder, a plasticizer, a lubricant, etc. are added to starting material powders, and they are wet-mixed to give a slurry. In this process, a predetermined amount of a sintering adjuvant may be added. The process for producing a molded product is not particularly limited, and examples thereof include a method in which the obtained slurry is subjected to a treatment using a spray dryer to give dried spheroids.

The solvent used in the slurry is not particularly limited, but in terms of ease of handling water or a lower alcohol is preferable; more preferred examples include water, methanol, and ethanol, and methanol is particularly preferable. Furthermore, the binder may be selected as appropriate from known binders and is not particularly limited, but examples thereof include polyvinyl alcohol.

The plasticizer and the lubricant are not particularly limited either, and may be selected as appropriate from known plasticizers and lubricants. Specific examples of the plasticizer include polyethylene glycol, and specific examples of the lubricant include stearic acid.

The dried spheroids are preferably subjected to degreasing after molding. The molding method is not particularly limited and may be selected as appropriate from known molding methods. Molding may be carried out in one stage or in multiple stages.

Degreasing is preferably carried out by heating. The heating temperature is preferably 400° C. to 600° C. Furthermore, when carrying out degreasing, heating up to 400° C. is carried out in air, and heating at higher temperature is preferably carried out under an inert atmosphere.

The Faraday rotator that can be used in the present invention preferably has an insertion loss of no greater than 1 dB and an extinction ratio of at least 25 dB over the sample length L (cm) in the optical isolator of the present invention, and while taking into consideration errors caused by mounting and assembling it to the optical isolator it more preferably has an insertion loss of no greater than 0.5 dB and an extinction ratio of at least 35 dB, and yet more preferably an insertion loss of at least 0.01 dB but no greater than 0.3 dB and an extinction ratio of at least 35 dB but no greater than 50 dB. It is preferable for it to be in the above-mentioned range since an optical isolator having low loss and high isolation optical properties can be prepared.

Optical properties such as insertion loss and extinction ratio are measured in accordance with a standard method at a wavelength of 1.06 μm. The measurement conditions are 25° C.±10° C. and measurement is carried out in air.

The Faraday rotator that can be used in the present invention preferably has a transmittance (light transmittance) of at least 70% at a wavelength of 1.06 μm and a sample length of L cm (0.70≤L≤1.10), more preferably at least 72%, and yet more preferably at least 75%. The transmittance is preferably high, and the upper limit thereof is not particularly limited and may be no greater than 100%.

Transmittance is measured as the intensity of light when light having a wavelength of 1.06 μm is transmitted through a Faraday rotator having a thickness of L cm. That is, the transmittance is represented by the equation below.

$$\text{Transmittance} = I/I_o \times 100$$

(In the equation, I denotes the intensity of transmitted light (intensity of light that has been transmitted through a sample having a thickness of L cm), and denotes the intensity of incident light.)

When an oxide obtained has nonuniform transmittance, and the transmittance varies depending on the point of measurement, the transmittance of said oxide is defined as the average transmittance of any 10 points.

The hollow magnet unit group comprising the first hollow magnet, the second hollow magnet unit, and third hollow magnet unit in the optical module of the present invention is explained further.

The first hollow magnet and the second and third hollow magnet units are all preferably permanent magnets having as small a size as possible, and in order to obtain a large magnetic field intensity it is preferable to use a neodymium-iron-boron (NdFeB) system magnet.

In the optical device of the present invention, it is preferable that as shown in FIG. 1, the magnetic field polarity of the first hollow magnet 2 is in the direction of the optical axis, and the magnetic field polarity of the second hollow magnet unit 3 and the magnetic field polarity of the third hollow magnet unit 4 are mutually opposing in a direction normal to the optical axis. In accordance with this constitution, it is possible to maximize the magnetic flux density applied to the Faraday rotator.

In the basic design of the optical device of the present invention, it is important to shorten the length of the Faraday rotator in order to achieve a reduction in size, and the reduction in size is achieved by combining a Faraday rotator having a large Faraday effect with a magnet material (magnet) and a magnetic circuit having a high magnetic flux density. Furthermore, since optical damage to the Faraday rotator due to high power light, which is a problem in laser machines, is determined by the transmittance and length of the Faraday rotator, the higher the transmittance and the shorter the length of the Faraday rotator the better.

The optical device of the present invention is preferably made into an optical isolator by further comprising two or more sheets of flat birefringent crystal and one or more 45 degree optical rotators on the optical axis. In accordance with this constitution, a polarization-independent isolator can be obtained.

In this case, it is preferable that the optic axis of the flat birefringent crystal is in a direction at substantially 45 degrees relative to the optical axis and the thickness is at least 1.0 cm. In this case, it can be used for a beam diameter of φ1.0 mm, which is 1/10 of the thickness.

Accompanying an increase in output of a fiber laser, the requirements for an optical isolator mounted therein include the durability of each component toward high power light and being polarization-independent such that it is free from the influence of the polarization state of the transmitted light. In order to meet such requirements, a polarizer used is most suitably a birefringent crystal, which separates an optical beam by utilizing refractive index difference. As representative birefringent crystals, there are yttrium vanadate ($YVO_4$), rutile single crystal ($TiO_2$), calcite single crystal ($CaCO_3$), and α-BBO crystal ($BaB_2O_4$), which are transparent at a wavelength of 0.9 to 1.1 μm, and any one thereof may be used. Furthermore, in order to achieve the above-mentioned polarization independence, it is preferable to carry out flat machining such that the optic axis of the birefringent crystal is preferably approximately 45 degrees relative to the optical axis. Furthermore, since there is a proportional relationship between the thickness thereof and the separation distance of extraordinary light, each may be machined with high precision to a thickness that satisfies a desired amount of beam shift. Two of these flat birefringent polarizers are disposed as incident/emerging light polarizers; disposed between these two are a Faraday rotator that has a Faraday rotation angle of 45 degrees at any wavelength from 0.9 to 1.1 μm and a 45 degree optical rotator that rotates the plane of polarization through 45 degrees at the same wavelength, and disposed therearound is a magnet that gives a magnetic field in the direction of the optical axis of the Faraday rotator, thus constituting a polarization-independent optical isolator.

The optical isolator comprising the optical module of the present invention is used in machining or marking applications in the industrial laser field, and is suitably used together with a high output laser.

In the present invention, in accordance with the use of a Faraday rotator having a large Verdet constant, and a magnet material and a magnetic circuit having a large magnetic flux density, a reduction in the size of an optical module for an optical isolator can be achieved.

Since the Faraday rotator used in the present invention has a Verdet constant that is at least twice that of a conventional rotator such as a TGG crystal, a Faraday rotator having a short sample length can be used. In accordance with use of a magnet material and a magnetic circuit having a large magnetic flux density for this Faraday rotator, the size of the optical module can be reduced. Because of this, the degree of freedom in spatial dimensions within a device into which the Faraday rotator is incorporated can be increased. Furthermore, since the sample length of the Faraday rotator can be shortened to about ½, it is possible to suppress optical damage to the Faraday rotator that might be caused by a high output laser.

Moreover, subjecting a roughly machined cylindrical Faraday rotator that has been grown and shaped to peripheral grinding enables residual strain on the outer periphery to be removed, thereby giving a Faraday rotator having a high extinction ratio and low loss. Incorporating this Faraday rotator into the above-mentioned magnet enables an optical module having a high extinction ratio and low loss to be constructed.

EXAMPLES

Example 1

An optical module having the constitution shown in FIG. 1 was prepared.

As the Faraday rotator, a terbium yttrium oxide having a Verdet constant of at least 0.27 min/(Oe·cm) at a wavelength of 1.06 μm was used as a sample length of 0.7 to 1.1 cm. A hollow magnet comprising a neodymium-iron-boron (NdFeB) system magnet was disposed on the outer periphery of the Faraday rotator. A magnetic circuit was formed by disposing hollow magnet units that were equally divided into four in directions of 90 degrees relative to the optical axis and having opposite magnetic field polarities on opposite sides of the hollow magnet, the magnetic field polarity of the respective divided magnets being in a direction normal to the optical axis. A carbon steel housing was disposed on the outside of the magnet and the magnet units.

The Faraday rotator 1 used in Example 1 is now explained in detail. The material was a ceramic containing terbium yttrium oxide at 99.99 wt %, the composition thereof being a $(Tb_{0.6}Y_{0.4})_2O_3$ ceramic, for which x=0.6 in Formula (I) above. The sample shape was a cylindrical shape having an outer diameter of φ6.1 mm and a length of 11.7 mm, and when the optical properties at a wavelength of 1.06 μm were measured, it was found that the insertion loss was 0.4 dB and the extinction ratio was 39 dB. Subsequently, the outer periphery of this ceramic was subjected to grinding of 1.3 mm so that the outer diameter was φ3.5 mm, the end faces were subjected to polishing of 0.6 mm for one side to give a length of 10.5 mm so that the transmitted wavefront precision was no greater than λ/4, the squareness displacement was no greater than 0.02 degrees, and the parallelism of opposite end faces was no greater than 10 sec, and when measurement at a wavelength of 1.06 μm was carried out, it was found to have optical properties such that the insertion loss was 0.1 dB, the extinction ratio was 43 dB, and the Verdet constant was 0.30 min/(Oe·cm). In addition, opposite end faces of the Faraday rotator were provided with an anti-reflection coating for use in air at a wavelength of 1.06 μm.

Examples 2 and 3

The relationship between the Tb content ratio x (0.5 to 1.0) in Formula (I) above and the Verdet constant was examined. Example 2 was carried out in the same manner as in Example 1 except that a ceramic containing an oxide having a composition of $(Tb_{0.5}Y_{0.5})_2O_3$ for which x=0.5 at the same wt % was used.

Furthermore, Example 3 was carried out in the same manner as in Example 1 except that a ceramic containing a $Tb_2O_3$ oxide for which x=1.0 at the same wt % was used.

The Verdet constant of the ceramics having these compositions was measured. From the results, it was found that the Verdet constant was 0.27 min/(Oe·cm) for x=0.5, and 0.43 min/(Oe·cm) for x=1.0. Furthermore, the extinction ratio was 43 dB in both Examples 2 and 3.

Figure 4:
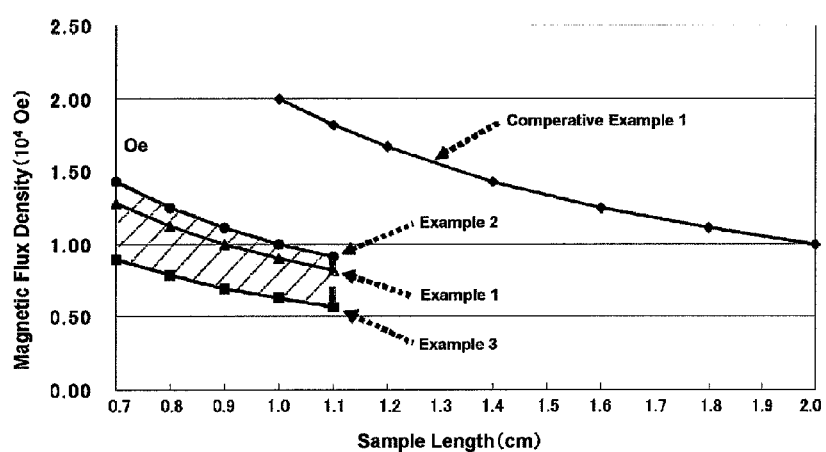
FIG. 4 is a diagram showing the magnitude of magnetic flux density T ($10^4$ Oe) at which the Faraday rotation angle becomes 45 degrees with respect to sample length L (0.7 to 1.1 cm) of Faraday rotators used in Examples 1 to 3 and Comparative Example 1.

FIG. 4 shows the magnetic flux density T ($10^4$ Oe) that gave a Faraday rotation angle of 45 degrees as a function of sample length L (cm) when the sample length of the ceramic used in Examples 1 to 3 was changed from 0.7 to 1.1 cm in 0.1 cm intervals.

In the case in which the above-mentioned sample length was 1.05 cm, when a magnetic flux density that gave a Faraday rotation angle of 45 degrees was calculated from the Verdet constant value (0.30 min/(Oe·cm)) of Example 1, it was found that the required magnetic flux density was about 8,500 Oe (=0.85T).

Comparative Example 1

As shown in FIG. 4, an optical isolator in which a TGG crystal (Verdet constant 0.135 min/(Oe·cm)) was the Faraday rotator was prepared as Comparative Example 1.

When the magnetic flux density applied to this TGG crystal was calculated, it was found that the magnetic flux density required at a sample length of 1.05 cm was about 19,000 Oe (=1.9T), and similarly at a sample length of 2.00 cm, which corresponded to the lower limit for the magnetic flux density, it was about 10,000 Oe (=1.0T).

Therefore, in all of the optical isolators of the present invention, the relationship between magnetic flux density and sample length was the relationship shown by Examples 1 to 3, and all were within a range that satisfied Formula (1) and Formula (2) in <1> above (ref. hatched area in FIG. 4).

Compared with a magnet used for a TGG crystal, in the optical module of the present invention, since the sample length of the Faraday rotator and the magnetic flux density supplied can be made small, the outer diameter of the magnet can be made small, and as a result a small-sized optical module can be realized. In addition to reduction in the size of the optical module product shape, magnetic field leakage from the optical module to the outside can also be reduced.

In order to realize the above, the magnetic flux density distribution to be obtained was determined by magnetic field analysis using the outer diameter of each magnet as a parameter. As an analytical method, a finite element method (JMAG-Designer) was selected, the magnet material was a neodymium-iron-boron (NdFeB) magnet manufactured by Shin-Etsu Chemical Co., Ltd., and the material of the housing 6 was carbon steel. The simulation results are shown in FIG. 5.

Figure 5:
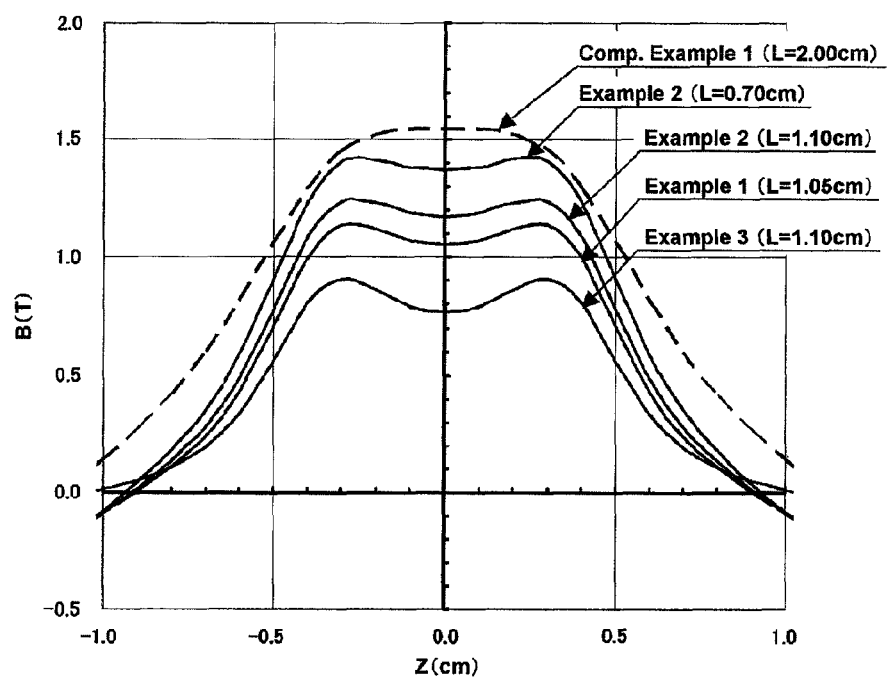
FIG. 5 is a diagram showing shape analysis results of an NdFeB system magnet based on a finite element method.
Explanation of Reference Numerals and Symbols in Figures is made as follows:
1 Faraday rotator
2 First hollow magnet
3 Second hollow magnet unit
4 Third hollow magnet unit
5 External holder
6 Housing
L Sample length

In FIG. 5, Z (cm) denotes the distance from the central axis where the Faraday rotator is disposed, and 0 cm denotes the middle on the central axis (the middle of where the Faraday rotator is disposed). That is, when the sample length of the Faraday rotator is 1.0 cm, the end points of the Faraday rotator correspond to $Z=\pm 0.5$ cm, and similarly when the sample length of the Faraday rotator is 0.70 cm, the end points of the Faraday rotator correspond to $Z=\pm 0.35$ cm.

From the results of the simulation in FIG. 5, it was found that a stable magnetic flux density relative to the optical axis direction (Z) could be obtained.

The upper limit for the magnetic flux density that satisfies Formula (1) and Formula (2) denotes the magnetic flux density distribution at a sample length of 0.70 cm in Example 2 and the lower limit for the magnetic flux density denotes the magnetic flux density distribution at a sample length of 1.10 cm in Example 3, the magnet shapes being an inner diameter of φ0.4 cm and an outer diameter of φ1.4 (lower limit) to φ2.4 cm (upper limit).

Furthermore, in order to satisfy a magnetic flux density of 8,500 Oe (=0.85 T) applied to the Faraday rotator 1 (sample length 1.05 cm, outer diameter φ3.5 mm) used in Example 1, a magnetic flux density distribution shown as Example 1 in FIG. 5 was the most suitable. From this result, the magnet shape used when the constitution of Example 1 was employed was an inner diameter of φ0.4 cm, an outer diameter of φ1.8 cm, and a length of 3.2 cm when it was actually produced by combining the first, second, and third hollow magnets. When the Faraday rotation angle of this assembled product was measured at a wavelength of 1.06 μm, the Faraday rotation angle was 45.0 degrees, which coincided with the simulation result. Moreover, the magnet shape employing the TGG crystal having a sample length of 2.00 cm, which was the lower limit value for the conventional constitution shown in Comparative Example 1, was an inner diameter of φ0.4 cm, an outer diameter of φ2.8 cm, and a length of 3.8 cm, and comparing the two it was found that the present invention realizes a size reduction of 65% as a ratio by volume compared with the conventional product.

Furthermore, when the insertion loss and the extinction ratio of the optical module prepared in Comparative Example 1 above were measured at a wavelength of 1.06 μm, it was found that the optical properties were an insertion loss of φ0.1 dB and an extinction ratio of 34 dB.

From the above content, the optical module of the present invention functions as an optical module having a sufficiently small size and a high extinction ratio in which each component used and the constitution thereof have durability toward high power light in the 1 μm region.

What is claimed is:

1. A process of producing an optical module comprising:
   a Faraday rotator having a Verdet constant at a wavelength of 1.06 μm of at least 0.27 min/(Oe·cm);
   a first hollow magnet disposed on the outer periphery of the Faraday rotator; and
   a second hollow magnet unit and a third hollow magnet unit, the second and third hollow magnet units disposed so as to sandwich the first hollow magnet on an optical axis,
   each of the second and third hollow magnet units comprising 2 or more magnets equally divided in a direction of 90 degrees relative to the optical axis,
   the Faraday rotator applied thereto a magnetic flux density B (Oe) in the range of Formula (1) below,
   the Faraday rotator having a length L (cm) along the optical axis in the range of Formula (2) below, and
   the Faraday rotator having an external diameter D (cm) in the range of Formula (3) below $$0.5 \times 10^4 \leq B \leq 1.5 \times 10^4 \quad (1)$$

$$0.70 \leq L \leq 1.10 \quad (2)$$

$$0.20 \leq D \leq 0.60 \quad (3)$$

wherein the Faraday rotator comprises an oxide represented by Formula (I) below in at least 99% by weight:

$$(Tb_xR_{1-x})_2O_3 \quad (I),$$

wherein $0.5 \leq x \leq 1.0$, and R comprises at least one element selected from the group consisting of scandium, yttrium, and lanthanoid elements other than Tb, the process comprising the steps of:
   grinding an outer peripheral face of the Faraday rotator by 1.0 mm or greater to reduce the external diameter D to the diameter of Formula (3); and
   polishing opposite end faces of the Faraday rotator by 0.5 mm or greater for each face to reduce the length to the length L of Formula (2).

2. The process of producing an optical module according to claim 1, wherein the Faraday rotator comprises an oxide represented by Formula (I) below in at least 99 wt %

$$(Tb_xR_{1-x})_2O_3 \quad (I)$$

wherein x is $0.5 \leq x \leq 1.0$, and R comprises at least one element selected from the group consisting of scandium, yttrium, and lanthanoid elements other than Tb.

3. The process of producing an optical module according to claim 1, wherein the oxide is a single crystal.

4. The process of producing an optical module according to claim 1, wherein the oxide is a ceramic.

5. The process of producing an optical module according to claim 1, wherein the Faraday rotator has a cylindrical shape and has an insertion loss of no greater than 1 dB and an extinction ratio of at least 25 dB.

6. The process of producing an optical module according to claim 1, wherein the first hollow magnet and the second and third hollow magnet units comprise a neodymium-iron-boron (NdFeB) system magnet.

7. The process of producing an optical module according to claim 1, wherein the first hollow magnet has a magnetic field polarity in a direction of the optical axis and the second and third hollow magnet units have a magnetic field direction in a direction normal to the optical axis.

8. The process of producing an optical module according to claim 1, wherein the first hollow magnet, the second hollow magnet unit, and the third hollow magnet unit are mounted in an interior of a carbon steel housing.

* * * * *